United States Patent [19]

Watanabe et al.

[11] Patent Number: 5,055,713

[45] Date of Patent: Oct. 8, 1991

[54] OUTPUT CIRCUIT OF SEMICONDUCTOR INTEGRATED CIRCUIT

[75] Inventors: Yuji Watanabe, Kawasaki; Hiroshi Sahara, Yokohama, both of Japan

[73] Assignee: Kabushiki Kaisha Toshiba, Kawasaki, Japan

[21] Appl. No.: 438,258

[22] Filed: Nov. 20, 1989

[30] Foreign Application Priority Data

Nov. 21, 1988 [JP] Japan .................. 63-293882

[51] Int. Cl.⁵ .................. H03K 5/00; H03K 19/003; H03K 19/017; H03K 19/094
[52] U.S. Cl. .................. 307/443; 307/473; 307/590; 307/451
[58] Field of Search .............. 307/443, 445, 473, 590, 307/592, 451

[56] References Cited

U.S. PATENT DOCUMENTS

| | | |
|---|---|---|
| 4,063,117 | 12/1977 | Laugesen et al. . |
| 4,567,378 | 1/1986 | Raver . |
| 4,638,187 | 1/1987 | Boler et al. . |
| 4,656,370 | 4/1987 | Kanuma . |
| 4,694,207 | 9/1987 | Heuwieser et al. . |
| 4,698,529 | 10/1987 | Asami .................. 307/592 |
| 4,719,369 | 1/1988 | Asano et al. . |
| 4,725,747 | 2/1988 | Stein et al. . |
| 4,731,553 | 3/1988 | Van Lehn et al. . |
| 4,740,717 | 4/1988 | Fletcher et al. . |
| 4,748,494 | 5/1988 | Yamada et al. . |
| 4,754,170 | 6/1988 | Toda et al. . |
| 4,758,743 | 7/1988 | Dehganpour et al. . |
| 4,771,195 | 9/1988 | Stein . |
| 4,777,389 | 10/1988 | Wu et al. . |
| 4,779,013 | 10/1988 | Tanaka . |
| 4,783,604 | 11/1988 | Ueno . |
| 4,785,201 | 11/1988 | Martinez . |
| 4,785,203 | 11/1988 | Nakamura . |
| 4,789,796 | 12/1988 | Foss . |
| 4,880,997 | 11/1989 | Steele .................. 307/473 |
| 4,883,978 | 11/1989 | Ohshima et al. . |
| 4,918,339 | 4/1990 | Shigeo et al. . |
| 4,924,120 | 5/1990 | Sclenck .................. 307/443 |
| 4,928,023 | 5/1990 | Marshall .................. 307/443 |

FOREIGN PATENT DOCUMENTS 62-123827 6/1987 Japan .
62-130020 6/1987 Japan .

Primary Examiner—Stanley D. Miller
Assistant Examiner—Scott A. Ouellette
Attorney, Agent, or Firm—Banner, Birch, McKie & Beckett

[57] ABSTRACT

This invention discloses an output circuit in an integrated circuit. This invention includes first and second MOS transistors and a drive and control circuit. The first and second MOS transistors are connected in series between Vcc and Vss power source nodes, and receive complementary signals, respectively. When one of the transistors is OFF, and the other transistor is turned off from an ON state, the drive and control circuit moderately decreases a gate potential of the other transistor to a level at which a transconductance of the transistor which is turned off from an ON state is decreased to some extent. Thereafter, the drive and control circuit decreases the gate potential to a level at which the transconductance is sufficiently decreased.

13 Claims, 8 Drawing Sheets

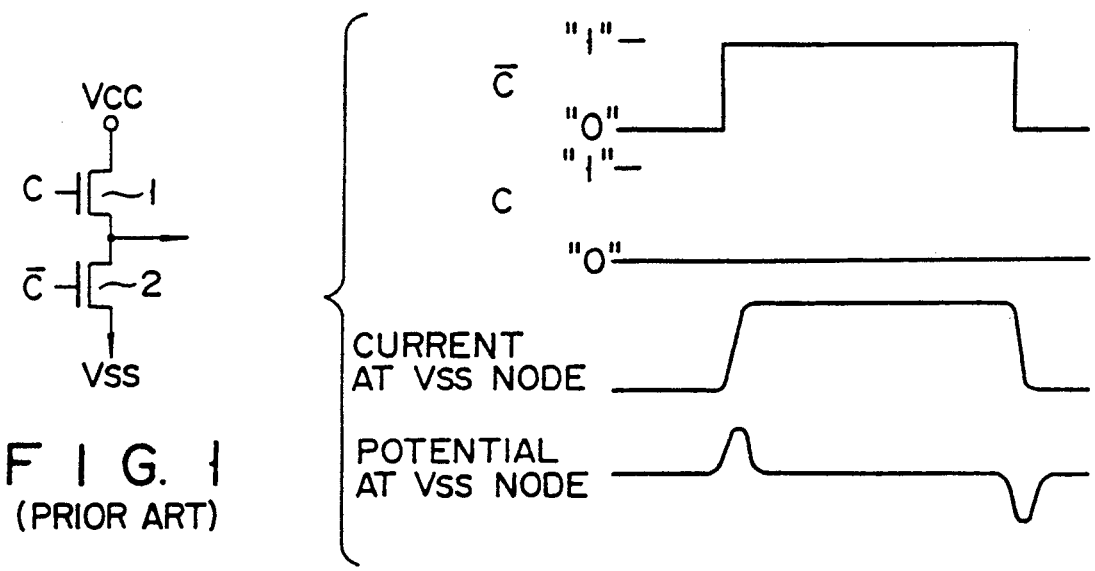
FIG. 1 (PRIOR ART)
FIG. 2 (PRIOR ART)
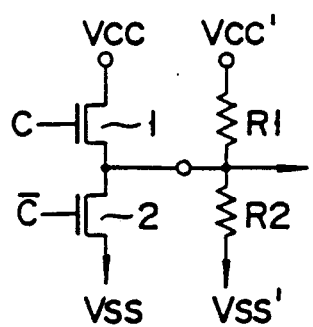
FIG. 3 (PRIOR ART)
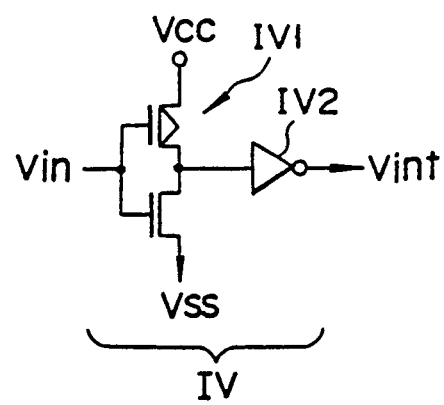
FIG. 4 (PRIOR ART)

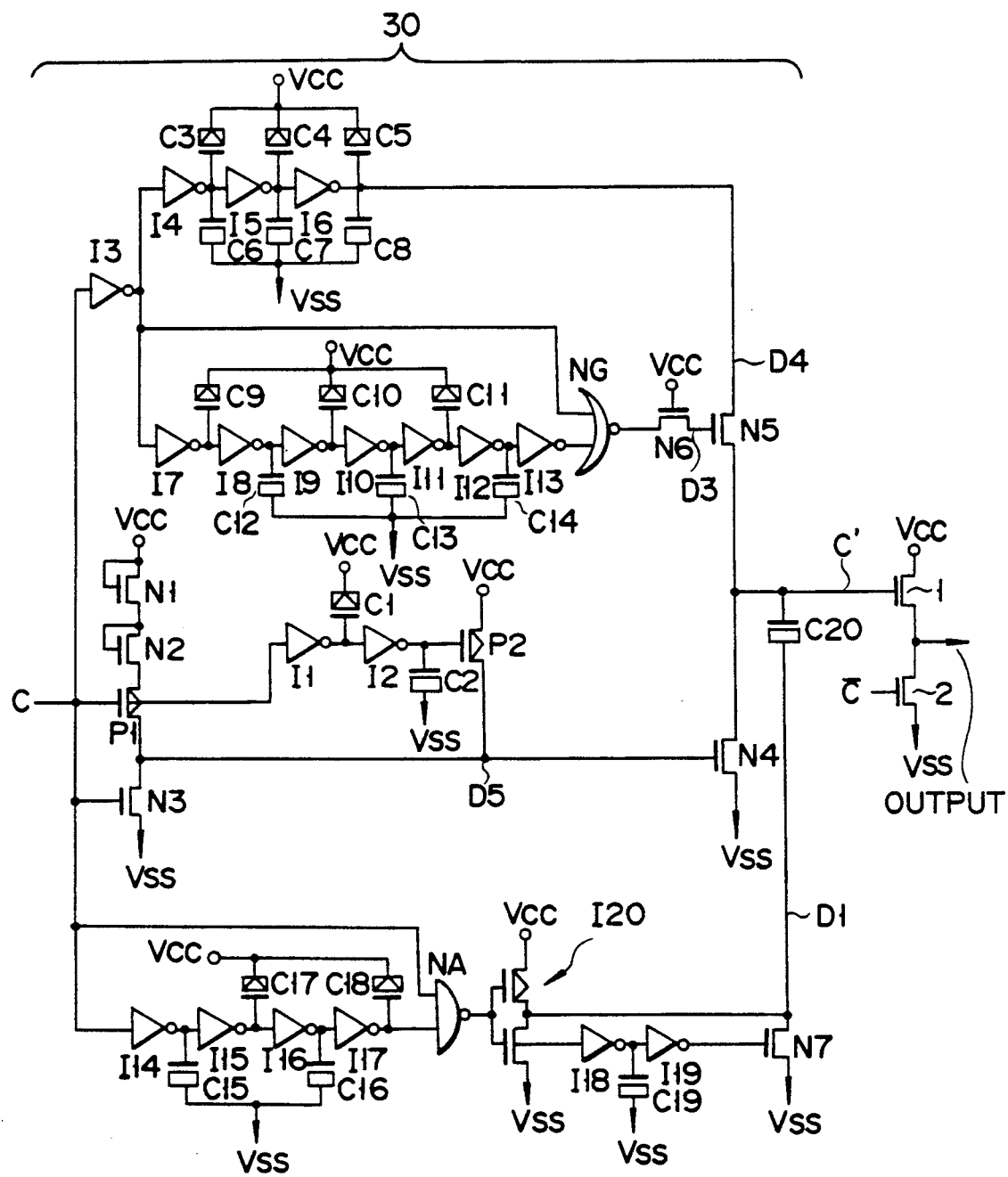
F I G. 7

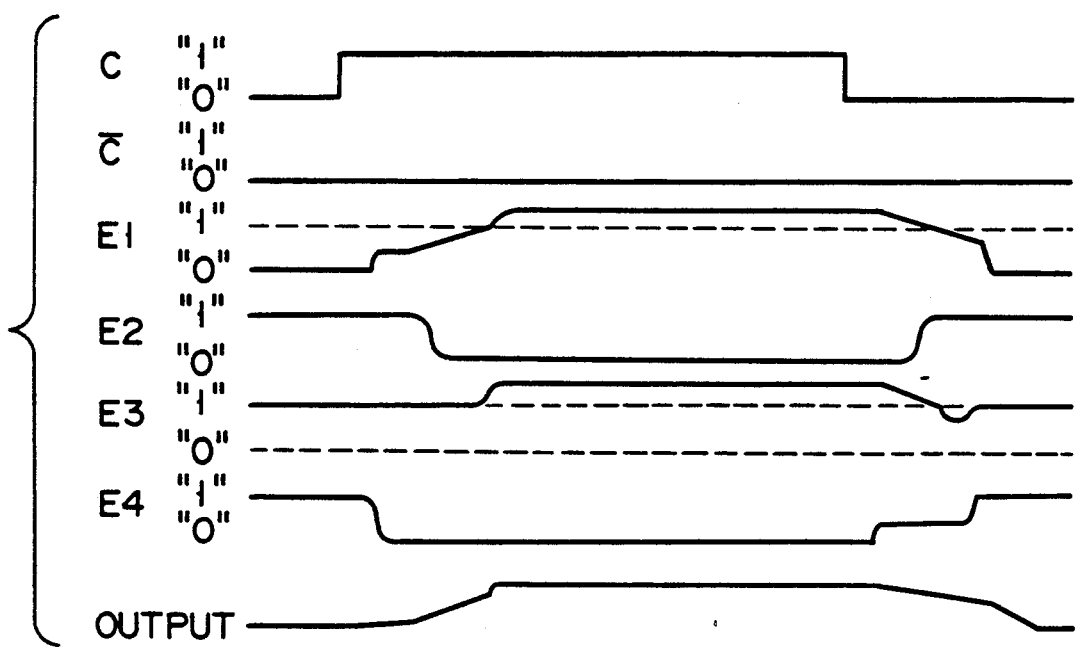
F I G. 10

OUTPUT CIRCUIT OF SEMICONDUCTOR INTEGRATED CIRCUIT

BACKGROUND OF THE INVENTION

1. Field of the Invention

The present invention relates to an output circuit of a semiconductor integrated circuit and, more particularly, to an output circuit used for an insulated gate (MOS) semiconductor memory.

2. Description of the Related Art

As shown in FIG. 1, in a conventional output circuit used for a MOS memory, first and second output n-channel MOS transistors 1 and 2 are connected in series between a Vcc power source node and a Vss power source node (ground potential). The gates of the two transistors 1 and 2 receive complementary signals C and $\overline{C}$, respectively. A series-connected point of the two transistors 1 and 2 serves as an output node.

When the signal C is set at high level "1", and the signal $\overline{C}$ is set at low level "0", the first transistor 1 is turned on and the second transistor 2 is turned off, thus setting a "1" output state. In contrast to this, when the signal C is set at low level "0", and the signal $\overline{C}$ is set at high level "1", the first transistor 1 is turned off and the second transistor 2 is turned on, thus setting a "0" output state. When both the signals C and $\overline{C}$ are set at "0" level, both the first and second MOS transistors 1 and 2 are turned off and the output node potential is set in a floating state, thus setting a high-impedance state.

As shown in FIG. 2, when the level of the signal $\overline{C}$ is rapidly changed to set the "0" output state, the second transistor 2 is rapidly turned on, and electric charges accumulated in a load capacitor connected to the output node are rapidly discharged to the Vss node. Therefore, a pulse potential at the Vss node is increased, and high-level noise is generated at the Vss node.

On the other hand, as shown in FIG. 3, in order to prevent a floating state of the output node potential when both the signals C and $\overline{C}$ are set at "0" level, external resistors R1 and R2 are often connected between the output node and the Vcc' and Vss' nodes, respectively, to set the output node at a given intermediate potential when both the signals C and $\overline{C}$ are set at "0" level.

In this output circuit, however, if the signal $\overline{C}$ rapidly goes from "1" level to "0" level to release the above-mentioned "0" output state and to set a high-impedance state while the signal C is kept at "0" level, the second transistor 2 is immediately turned off, and a current supplied from the Vcc' node to the Vss node through the resistor R1 and the second transistor 2 is rapidly cut off. In this case, voltage noise is generated at the Vss node, and a pulse potential of the Vss node is decreased. This voltage noise is defined as:

$$WV = L \cdot (di/dt)$$

where L is an inductance component which is present in, e.g., a wiring layer of the Vss node, a bonding wire, or a lead frame, di is a change in current, and dt is a time change.

As described above, in the output circuit, when noise is generated to increase or decrease the pulse potential of the Vss node during "0" data output or output inversion in a "0" data output release state, other internal circuits, e.g., an input buffer IV consisting of two CMOS inverters shown in FIG. 4, formed on a single chip together with the output circuit may be erroneously operated.

In other words, assume that noise having a high-potential pulse at the Vss node is generated when an input Vin of the input buffer IV is set at, e.g., high level. A potential difference between the high-level input Vin and the Vss node is decreased, and a first inverter IV1 undesirably detects that the input Vin is set at low level. An output Vout from the first inverter IV1 is set at high level, and an output Vint from a second inverter IV2 goes to low level. As a result, an operation error of the semiconductor integrated circuit may occur.

In FIG. 1, when the level of the signal C is rapidly changed to set a "1" output state, the first transistor 1 is rapidly turned on, and a current is rapidly supplied from the Vcc node to the output node through the first transistor 1. In this case, voltage noise is generated at the Vcc node, and the potential at the Vcc node is decreased. This voltage noise is defined as:

$$WV = L \cdot (di/dt)$$

where L is an inductance component which is present in, e.g., a wiring layer of the Vcc node, a bonding wire, or a lead frame, di is a change in current, and dt is a time change.

In FIG. 1, if the signal C rapidly goes from "1" level to "0" level to release the above-mentioned "1" output state and to set a high-impedance state, the first transistor 1 is immediately turned off. Also in this case, as described above, voltage noise defined as $WV = L \cdot (di/dt)$ is generated at the Vcc node, and the potential at the Vcc node is increased.

As described above, when noise is generated and the pulse potential of the Vcc node is decreased or increased during "1" data output or output inversion in a "1" data output release state, other internal circuits, e.g., the input buffer IV shown in FIG. 4, formed on a single chip together with the output circuit may be erroneously operated.

As multi-bit MOS memories are developed, a large number of output circuits are simultaneously operated, and a change in output current is increased. Along with this large change, noise, generated when an output from the above-mentioned output circuit is changed, is further increased. This problem is very important.

SUMMARY OF THE INVENTION

The present invention has been made to solve the above problem that an operation error of internal circuits of an integrated circuit occurs due to noise generated upon a change in output from an output circuit, and has as its object to provide an output circuit of a semiconductor integrated circuit which can reduce noise generated upon a change in output from the output circuit, and can prevent an operation error of internal circuits of the integrated circuit.

According to a first aspect of the present invention, there is provided an output circuit of a semiconductor integrated circuit, having first and second output MOS transistors which are connected in series between first and second power source nodes, and the gates of which receive different signals, including a drive and control circuit for driving the second transistor as follows. When the second transistor connected to the second power source node is turned on, its gate potential is rapidly increased, to some extent, to a level at which a transconductance of the second transistor is not extremely increased, i.e., a level at which voltage noise defined as the above-mentioned equation $WV=L.(di/dt)$ does not satisfy VIN−WV <VIH (VIH: a minimum value that the circuit determines the input VIN as Hi level). Thereafter, the gate potential is slowly increased to a level at which the transconductance of the second transistor is sufficiently high, i.e., a level at which output current specification can be satisfied. When the second transistor is turned off from an ON state, its gate potential is slowly decreased to a level at which the transconductance of the second transistor is decreased, to some extent, i.e., a level at which power source noise defined as $WV=L.(di/dt)$ does not satisfy VIN+WV>VIL (VIL: a maximum value that the circuit defines the input VIN as "L" level). Thereafter, the gate potential is decreased to a level at which the transconductance of the second transistor is sufficiently low.

According to a second aspect of the present invention, there is provided an output circuit of a semiconductor integrated circuit, having first and second output MOS transistors which are connected in series between first and second power source nodes, and the gates of which receive different signals, including a drive and control circuit for increasing a gate potential of the first transistor in a two-stage manner when the first transistor connected to the first power source node is turned on, and for decreasing the gate potential of the first transistor in a two-stage manner when the first transistor is turned off from an ON state.

According to a third aspect of the present invention, there is provided an output circuit of a semiconductor integrated circuit, having first and second output MOS transistors which are connected in series between first and second power source nodes, and the gates of which receive different signals, the first transistor being divided into two transistors, including a drive and control circuit for driving the two-divided first transistors as follows. When the first transistor is turned off from an ON state, in the two-divided transistors, a time difference is set between the falling edge of a gate potential of one transistor and a falling edge of a gate potential of other transistor, and the falling edge of the gate potential of one transistor is slowly changed as compared with the falling edge of the gate potential of the other transistor.

The output circuit of the semiconductor integrated circuit according to the first aspect can prevent a rapid flow of electric charges into the second power source node when the second transistor is turned on. In addition, a rapid cut-off of a current supplied to the second power source node can be prevented when the second transistor is turned off from an ON state. Therefore, noise generated at the second power source node can be reduced, thus preventing an operation error of internal circuits of the integrated circuit.

The output circuit of the semiconductor integrated circuit according to the second aspect can prevent an abrupt flow of a current from the first power source node to the first transistor when the first transistor is turned on. In addition, an abrupt cut-off of the current supplied from the first power source node can be prevented when the first transistor is turned off from an ON state. Therefore, noise generated at the first power source node can be reduced, thus preventing an operation error of the internal circuits of the integrated circuit.

The output circuit of the semiconductor integrated circuit according to the third aspect can prevent an abrupt cut-off of a current supplied from the first power source node when the first transistor is turned off from an ON state. Therefore, noise generated at the first power source node can be reduced, thus preventing an operation error of the internal circuits of the integrated circuit.

BRIEF DESCRIPTION OF THE DRAWINGS

FIG. 1 is a circuit diagram of a conventional output circuit of a semiconductor integrated circuit;

FIG. 2 is a timing chart of the output circuit shown in FIG. 1;

FIG. 3 is a circuit diagram of an output circuit obtained by externally connecting resistors to output nodes of the output circuit shown in FIG. 1;

FIG. 4 is a circuit diagram of an input circuit of a semiconductor integrated circuit;

FIG. 7 is a circuit diagram of an output circuit of a semiconductor integrated circuit according to a second embodiment of the present invention;

FIG. 10 is a timing chart of the output circuit shown in FIG. 9; and

DETAILED DESCRIPTION OF THE PREFERRED EMBODIMENTS

Preferred embodiments of the present invention will be described hereinafter in detail with reference to the accompanying drawings.

Figure 5:
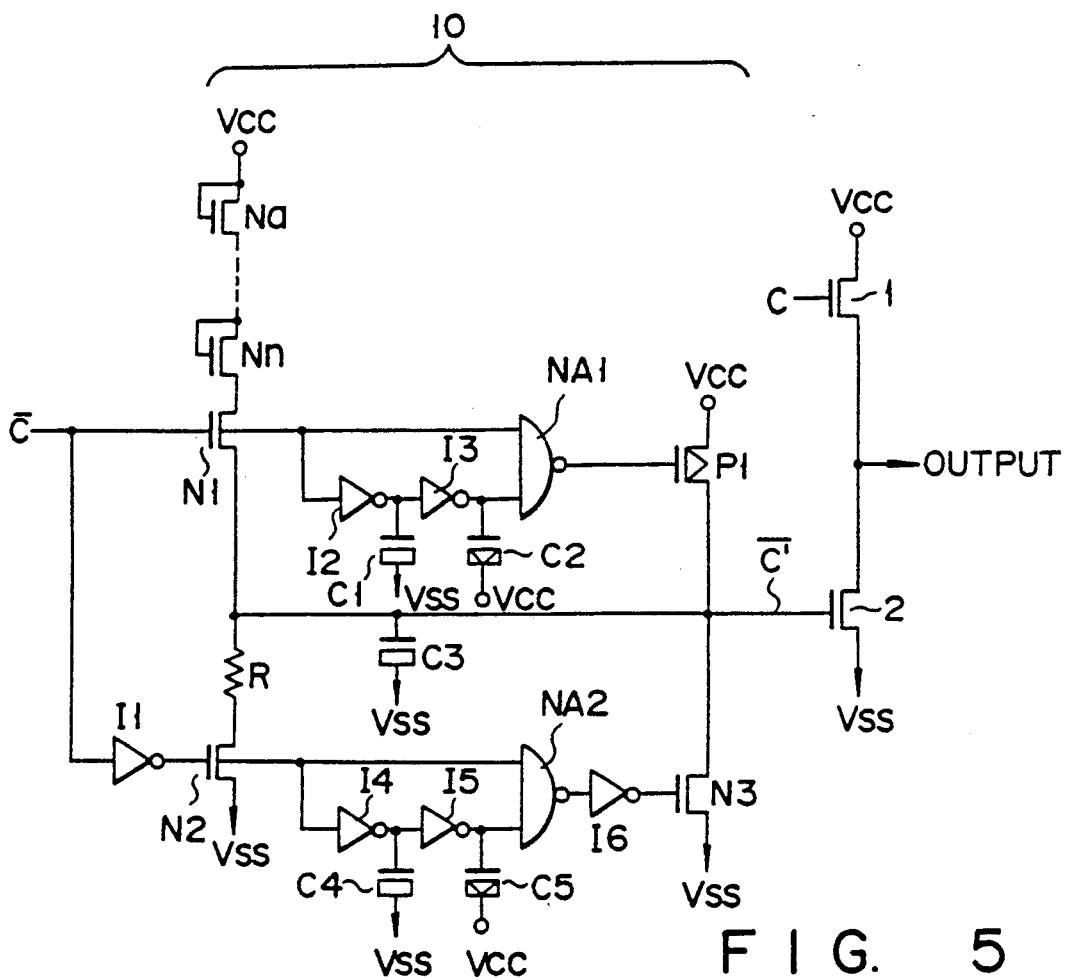
FIG. 5 is a circuit diagram of an output circuit of a semiconductor integrated circuit according to a first embodiment of the present invention.

FIG. 5 shows an output circuit of a semiconductor integrated circuit according to a first embodiment of the present invention. First and second output MOS n-channel transistors 1 and 2 are connected in series between a Vcc power source node and a Vss power source node (ground potential). The gates of the two transistors receive different signals C and $\overline{C}'$, respectively. A series-connected point of the two transistors serves as an output node. Reference numeral 10 denotes a drive and control circuit for driving and controlling the second transistor 2 connected to the Vss node. When the second transistor 2 connected to the Vss node is turned on, the drive and control circuit 10 rapidly increases a gate potential of the second transistor 2, to some extent, to a level at which a transconductance of the second transistor 2 is not extremely increased. Thereafter the gate potential is slowly increased to a level at which the transconductance of the second transistor is sufficiently high. When the second transistor 2 is turned off from an ON state, its gate potential is slowly decreased to a level at which a transconductance of the second transistor 2 is low to some extent. Thereafter, the gate potential is decreased to a level at which the transconductance of the second transistor 2 is sufficiently low. For example, the drive and control circuit 10 is arranged, as shown in FIG. 5.

More specifically, n n-channel transistors Na to Nn, the drains and gates of which are connected to each other, an n-channel transistor N1, the gate of which receives an input $\overline{C}$, a resistor R, and an n-channel transistor N2 ar connected in series between the Vcc and Vss nodes. The gate of the transistor N2 receives a signal obtained by inverting the input $\overline{C}$ by an inverter I1. A threshold voltage of each of the n n-channel transistors Na to Nn is denoted by reference symbol VTH.

A connecting point of the n-channel transistor N1 and the resistor R is connected to the gate of the second transistor 2. A p-channel transistor P1 is connected between the gate of the second transistor 2 and the Vcc node, and an n-channel transistor N3 is connected between this gate and the Vss node. The input $\overline{C}$ is supplied to one terminal of a first 2-input NAND gate NA1, and is also supplied to the other terminal of the 2-input NAND gate NA1 through two inverters I2 and I3. An output from the 2-input NAND gate NA1 is input to the gate of the p-channel transistor P1. A MOS capacitor C1 consisting of an n-channel MOS transistor, the drain and source of which are connected to the Vss node, is connected between the output node of the first inverter I2 of the two inverters I2 and I3 and the Vss node. A MOS capacitor C2 consisting of a p-channel MOS transistor, the drain and source of which are connected to the Vcc node, is connected between the output node of the second inverter I3 of the two inverters I2 and I3 and the Vcc node.

A MOS capacitor C3 consisting of an n-channel MOS transistor, the drain and source of which are connected to the Vss node, is connected between the Vss node and a connecting point of the n-channel transistor N1 and the resistor R. An output from the inverter I1 is supplied to one terminal of a second 2-input NAND gate NA2, and is also supplied to the other terminal of the NAND gate NA2 through two inverters I4 and I5. An output from the NAND gate NA2 is inverted by an inverter I6, and the inverted output is input to the n-channel transistor N3. A MOS capacitor C4 consisting of an n-channel MOS transistor, the drain and source of which are connected to the Vss node, is connected between the output node of the first inverter I4 of the two inverters I4 and I5 and the Vss node. A MOS capacitor C5 consisting of a p-channel MOS transistor, the drain and source of which are connected to the Vcc node, is connected between the output node of the second inverter I5 of the two inverters I4 and I5 and the Vcc node.

Figure 6:
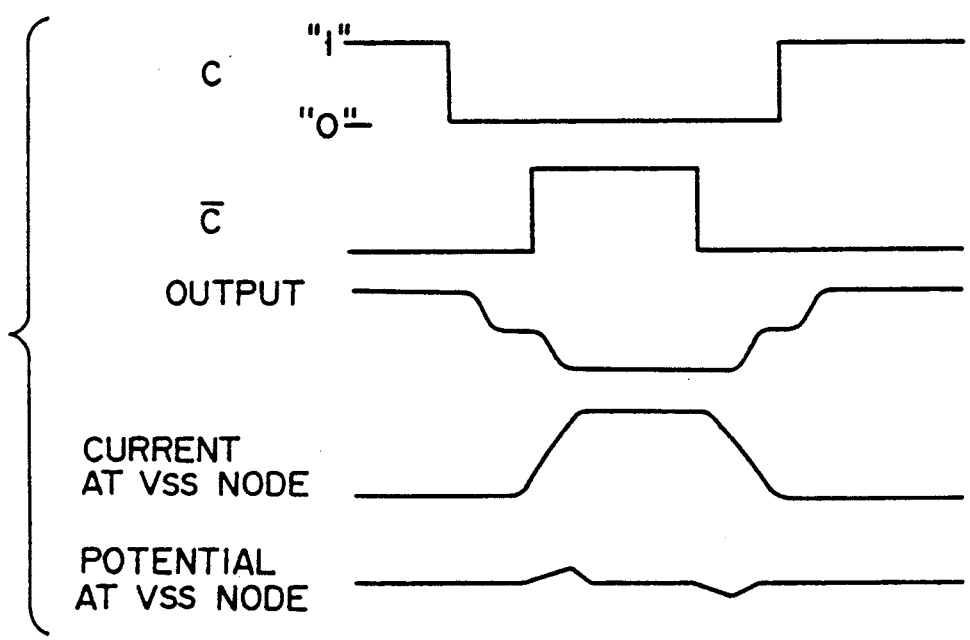
FIG. 6 is a timing chart of the output circuit shown in FIG. 5.

An operation of the output circuit shown in FIG. 5 will be described below with reference to FIG. 6. When "0" output is performed, the input C is kept at low level "0", and the transistor 1 is kept to be OFF. In this state, when the input $\overline{C}$ is set at high level "1", an output from the drive and control circuit 10 goes to high level immediately and the second output transistor 2 is turned on, thus setting a "0" output state. In other words, in the drive and control circuit 10, when the input $\overline{C}$ goes to "1" level, immediately an output from the inverter I1 goes to "0" level, an output from the second 2-input NAND gate NA2 goes to "1" level, an output from the inverter I6 goes to "0" level, and the n-channel transistor N3 is turned off. At this time, the n-channel transistor N1 is immediately turned on in accordance with "1" level of the input $\overline{C}$, and a voltage defined as Vcc−n.VTH appears at an output node $\overline{C}'$ of the drive and control circuit 10. When the value of Vcc−n.VTH is selected and set so that the transconductance of the second output transistor 2 is not too high, a current supplied to the Vss node is not rapidly changed.

Thereafter, when an inherent delay time period determined by the two inverters I2 and I3 and the MOS capacitors C1 and C2 has elapsed, an output from the first 2-input NAND gate NA1 goes to "0" level, the p-channel transistor P1 is turned on, the output node $\overline{C}'$ of the drive and control circuit 10 goes to "1" level, and the transconductance of the second output transistor 2 is increased. At this time, however, a certain amount of current is supplied to the Vss node, and a change di/dt in Vss node current as a function of time is not extremely increased. Therefore, noise generated at the Vss node can be reduced. In this case, the characteristics of the p-channel transistor P1 are set so that the output node $\overline{C}'$ is slowly set at "1" level when the p-channel transistor P1 is turned on.

On the other hand, when the "0" output state is released to set a high-impedance state, the input C is kept at low level "0", and the first transistor 1 is kept off. In this state, when the input $\overline{C}$ is set at low level "0", the output $\overline{C}'$ from the drive and control circuit 10 goes to low level, and the second output transistor 2 is turned off, thus setting a high-impedance state. In other words, in the drive and control circuit 10, when the input $\overline{C}$ goes to "0" level, an output from the first 2-input NAND gate NA1 goes to "1" level, and the p-channel transistor P1 is turned off. Even if a "1" output from the inverter I1 is input to the second 2-input NAND gate NA2, the gate NA2 outputs "1" in response to a "0" output from the inverter I5. An output from the inverter I6 is set at "0" level, so that the n-channel transistor N3 is OFF.

At this time, the n-channel transistor N2 is turned on in response to an output set at "1" level from the inverter I1, and a potential of the output node $\overline{C}'$ of the drive and control circuit 10 is changed to the Vss level. The potential of the output node $\overline{c}'$ is slowly decreased in accordance with a time constant determined by the MOS capacitor C3 and the resistor R. In this case, the transconductance of the second output transistor 2 is not rapidly decreased. The second transistor 2 is slowly turned off, and a current supplied to the Vss node is not rapidly cut off. Assuming that the power source noise caused by current variation is represented by WV=L(di/dt), the rate at which the transconductance varies is determined beforehand such that the input circuit does not satisfy the following relation:

$$V_{IN} + \Delta V > V_{IH}$$

where $V_{IH}$ denotes the higher-level threshold value of the input circuit.

Thereafter, when an inherent delay time period determined by the two inverters I4 and I5 and the MOS capacitors C4 and C5 has elapsed, an output from the second 2-input NAND gate NA2 goes to "0" level, an output from the inverter I6 goes to "1" level, and the n-channel transistor N3 is turned on. The output node of $\overline{C}'$ of the drive and control circuit 10 immediately goes to "0" level, and the conductance of the second output transistor 2 is decreased. At this time, however, a current supplied to the Vss node is decreased to some extent, and a change di/dt in Vss node current as a function of time is not extremely increased. Therefore, noise generated at the Vss node can be reduced.

According to the above-mentioned output circuit shown in FIG. 5, when the second output transistor 2 is turned on, an abrupt flow of electric charges into the Vss node can be prevented. When the second output transistor 2 is turned off from an ON state, an abrupt cutoff of the current supplied to the Vss node can also be prevented. Therefore, noise generated at the Vss node can be reduced, and an operation error of other internal circuits, e.g., an input buffer consisting of the two CMOS inverters shown in FIG. 4, formed on a single chip together with this output circuit can be prevented.

Note that when the input C is set at high level "1", and the input $\overline{C}$ is set at low level "0", the first transistor 1 is turned on and the second transistor 2 is turned off, thus setting a "1" output state. When both the inputs C and $\overline{C}$ are set at "0" level, both the first and second transistors 1 and 2 are turned off, thus setting a high-impedance state.

Figure 5A:
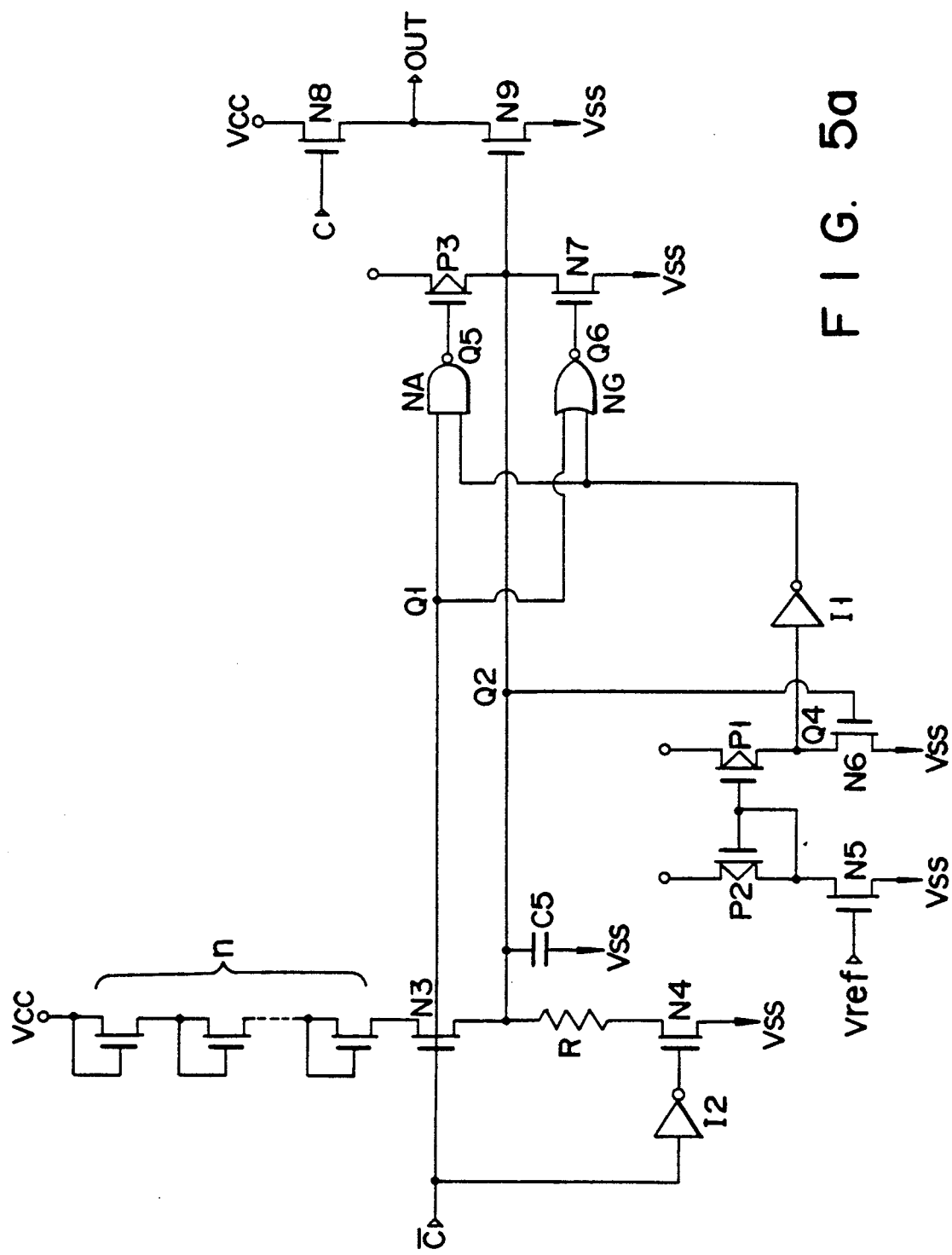
FIG. 5a is a circuit diagram of an output circuit of a semiconductor integrated circuit according to the first embodiment of the present invention.

FIG. 5a is a circuit diagram of an output circuit of a semiconductor integrated circuit according to the first embodiment of the present invention. In FIG. 5a, reference numerals N1, N2, N3, N4, N6, N7, N8 and N9 denote n-channel MOS transistors, reference numerals P1, P2 and P3 denote p-channel MOS transistors. Reference numeral C5 denotes a capacitor, R a resistor, NA a NAND gate, NG a NOR gate, and I1 and I2 inverters.

An operation of the output circuit shown in FIG. 5a will be described below. When an output is set at a high-impedance state, an input C is kept at low level "0", an input $\overline{C}$ changes to low level "0". As a result, a potential at node Q1 is changed to a low level "0", an output from the NAND gate NA is changed to "1" level, and the transistor P3 is turned off. On the other hand, the input C is inverted to level "1" by passing through the inverter I2, and the transistor N4 is turned on. A potential at node Q2 changes slowly to low level in accordance with a time constant determined by the capacitor C5 and the resistor R. When the potential at node Q2 is lowered below a reference potential Vref during the potential at node Q2, a potential at node Q4 is changed to high level, an output from the inverter I1 is changed to low level, and an output from the NOR gate NG is changed to high level. As a result, the transistor N7 is turned on, then the potential at node Q2 is changed rapidly to low level.

When the operation of the output circuit shown in FIG. 5a is performed as described above, the potential at node Q2 is slowly decreased, to some extent, to a level at which a transconductance of the transistor N9 is not extremely decreased, and thereafter, the potential at node Q2 is rapidly decreased. For this reason, since a current flowing through the transistor N9 is not rapidly changed, noise generated at Vss node can be reduced.

On the other hand, when the high-impedance state is released to set a output state, the input C is kept at low level "0", and the input $\overline{C}$ is changed to high level "1" In this state, transistor N3 is turned on, the potential at node Q2 begins to change to a level of Vcc-n×VTH. When the potential at node Q1 changed to high level "1", the output from the NOR gate NG is changed to low level "0", therefore, the transistor N7 is rapidly turned off. When the potential at node Q2 becomes higher than the reference potential Vref, the potential at node Q4 is changed to low level "0", the output from the inverter I is changed to high level "1". As a result, the output from the NAND gate NA is changed to low level "0", the transistor P3 is turned on. When the transistor P3 is turned on, the potential at node Q2 is slowly changed to high level "1".

When the operating of the output circuit shown in FIG. 5a is performed as described above, the potential at node Q2 rapidly increased, to some extent, to a level at which a transconductance of the transistor N9 is not extremely increases, and thereafter, the potential at node Q2 is slowly increased. Therefore, since a current flowing through the transistor N9 is not rapidly changed, noise generated at Vss node can be reduced.

FIG. 7 shows an arrangement of an output circuit of a semiconductor integrated circuit according to a second embodiment of the present invention. First and second output MOS n-channel transistors 1 and 2 are connected in series between Vcc and Vss power source nodes. The gates of the two transistors receive different signals C' and $\overline{C}$, respectively. A series-connected point of the two transistors serves as an output node. Reference numeral 30 denotes a drive and control circuit for driving and controlling the first transistor 1 connected to the Vcc node. In the drive and control circuit 30, when the first transistor 1 is turned on, its gate potential is changed in a two-stage manner. That is, the gate potential is rapidly increased until a transconductance of the first transistor 1 is increased to some extent. Thereafter, the gate potential is increased to a level at which the transconductance of the first transistor 1 is sufficiently high. When the first transistor 1 is turned off from an ON state, its gate potential is changed in a two-stage manner. That is, the gate potential is slowly decreased until the transconductance of the first transistor is decreased to some extent. Thereafter, the gate potential is decreased to a level at which the transconductance of the first transistor 1 is sufficiently low. For example, the drive and control circuit 30 is arranged, as shown in FIG. 7.

Assuming that the power source noise caused during the transient time of the gate potential is represented by $WV = L(di/dt)$, the rate at which the gate potential varies is determined beforehand such that the input circuit does not satisfy the following relation:

$$V_{IN} - \Delta V < V_{IL}$$

where $V_{IL}$ denotes the lower-level threshold value of the input circuit.

More specifically, a plurality of (e.g., two) n-channel transistors N1 and N2, the drains and gates of which are connected to each other, a p-channel transistor P1, the gate of which receives an input C, and an n-channel transistor N3, the gate of which receives the input C, are connected in series between the Vcc and Vss nodes. A threshold voltage of each of the n-channel transistors N1 and N2 is denoted by reference symbol VTH.

A connecting point of the p- and n-channel transistors P1 and N3 is connected to the gate of an n-channel transistor N4, and a p-channel transistor P2 is connected between the gate of the transistor N4 and the Vcc node. The input C is supplied to the gate of the p-channel transistor P2 through two inverters I1 and I2. A MOS capacitor C1 consisting of a p-channel MOS transistor, the drain and source of which are connected to the Vcc node, is connected between the Vcc node and the output node of the first inverter I of the two inverters I1 and I2. A MOS capacitor C2 consisting of an n-channel MOS transistor, the drain and source of which are connected to the Vss node, is connected between the Vss node and the output node of the second inverter I2 of the two inverters I1 and I2.

The input C is supplied to one terminal of an n-channel transistor N5 through four inverters I3 to I6. The other terminal of the transistor N5 is connected to the other terminal of the transistor N4. An interconnecting point of these transistors N5 and N4 is connected to the gate of the first output transistor 1. MOS capacitors C3 to C5 each consisting of a p-channel MOS transistor, the drain and source of which are connected to the Vcc node, are connected between the Vcc node and the output nodes of the second to fourth inverters I4 to I6 of the four inverters I3 to I6, respectively. MOS capacitors C6 to C8 each consisting of an n-channel MOS transistor, the drain and source of which are connected to the Vss node, are connected between the Vss node and the output nodes of the second to fourth inverters I4 to I6.

In addition, an output from the first inverter I3 of the four inverters I3 to I6 is directly supplied to one input terminal of a 2-input NOR gate NG, and is also input to the other input terminal of the 2-input NOR gate NG through seven inverters I7 to I13. MOS capacitors C9 to C11 each consisting of a p-channel MOS transistor, the drain and source of which are connected to the Vcc node, are connected between the Vcc node and the output nodes of the first, third, and fifth inverters of the seven inverters I7 to I13. MOS capacitors C12 to C14 each consisting of an n-channel MOS transistor, the drain and source of which are connected to the Vss node, are connected between the Vss node and the output nodes of the second, fourth, and sixth inverters of the seven inverters I7 to I13. An n-channel transistor N6, the gate of which is connected to the Vcc node, is connected between the output node of the 2-input NOR gate NG and the gate of the transistor N5.

The input C is directly supplied to one input terminal of the 2-input NAND gate NA, and is also supplied to the other input terminal of the 2-input NAND gate NA through four inverters I14 to I17. MOS capacitors C15 and C16 each consisting of an n-channel MOS transistor, the drain and source of which are connected to the Vss node, are connected between the Vss node and the output nodes of the first and third inverters of the four inverters I14 to I17. MOS capacitors C17 and C18 each consisting of a p-channel MOS transistor, the drain and source of which are connected to the Vcc node, are connected between the Vcc node and the output nodes of the second and fourth inverters of the four inverters I14 to I17.

An output from the 2-input NAND gate NA is input to the gate of an n-channel transistor N7 through two inverters I18 and I19, and is also supplied to the drain of the transistor N7 through an inverter I20. A MOS capacitor C19 consisting of an n-channel MOS transistor, the drain and source of which are connected to the Vss node, is connected between the Vss node and the output node of the first inverter I18 of the two inverters I18 and I19. The source of the transistor N7 is connected to the Vss node. The drain of the transistor N7 is connected to the gate of the first output transistor 1 through a MOS capacitor C20 consisting of an n-channel MOS transistor, the drain and source of which are connected to each other.

Figure 8:
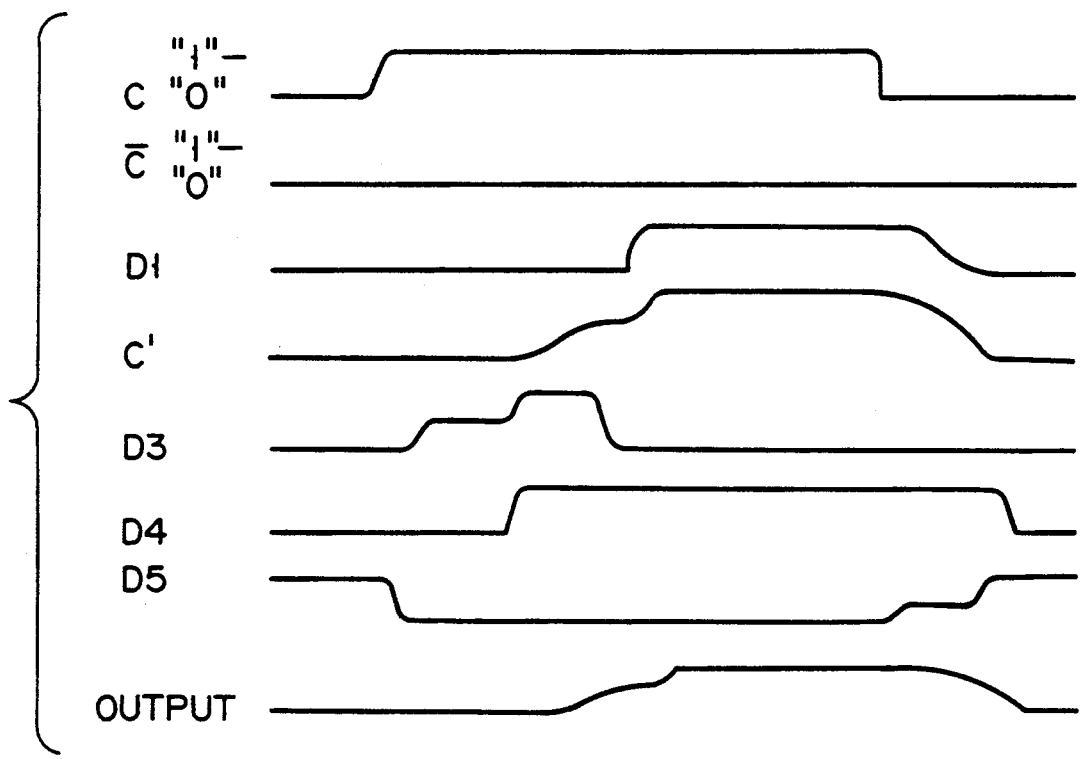
FIG. 8 is a timing chart of the output circuit shown in FIG. 7.

An operation of the output circuit shown in FIG. 7 will be described below with reference to FIG. 8. When "1" output is performed, the input $\overline{C}$ is kept at low level "0", and the second transistor 2 is kept off. In this state when the input C is set at high level "1", an output C1 from the drive and control circuit 30 goes to high level, and the first output transistor 1 is turned on, thus setting a "1" output state. In other words, in the drive and control circuit 30, when the input C goes to "1" level, the transistor N3 is turned on, its drain potential goes to "0" level, and the transistor N4 is turned off. At this time, an output from the inverter I3 goes to "0" level, an output from the 2-input NOR gate NG goes to "1" level, and the gate of the transistor N5 is charged at a potential defined as Vcc−VTH (VTH is a threshold voltage of the n-channel transistor N6). Note that, at this time, an output from the 2-input NAND gate NA is kept at "1" level, and an output from the inverter I20 is kept at "0" level. Therefore, the drain potential of the transistor N7 is kept to be decreased to "0" level. When a given delay time period determined by the inverters I4 to I6 and the MOS capacitors C3 to C8 has elapsed, "1" level output from the inverter I6 starts to charge the gate of the first output transistor 1 through the transistor N5, and increases the gate potential of the transistor N5 to be higher than Vcc potential. Therefore, the first output transistor 1 is turned on, and an output Vout is started to set at "1" level. At this time, when the size of the transistor N5 is properly set, a gate charging rate of the first output transistor 1 can be controlled, and an rapid increase in transconductance of the output transistor can be prevented, thus suppressing an abrupt change in Vcc current.

Thereafter, when a given delay time period determined by the inverters I7 to I12 and the MOS capacitors C9 to C14 has elapsed, an output from the inverter I13 goes to "1" level, an output from the 2-input NOR gate NG goes to "0" level, the gate potential of the transistor N5 goes to "0" level, and the transistor N5 is turned off. In addition, when a given delay time period determined by the inverters I14 to I17 and the MOS capacitors C15 to C18 has elapsed, an output from the inverter I17 goes to "1" level, an output from the 2-input NAND gate NA goes to "0" level, the transistor N7 is turned off, and an output from the inverter I20 is started to set at "1" level. Static induction by the MOS capacitor 20 causes this "1"-level output to set the gate potential of the first output transistor 1 at high level. Therefore, an ON current of the first output transistor 1 is increased, and the output Vout is completely set at "1" level. Note that a final level of the gate potential of the first output transistor 1 at this time is set at a level to allow a triode operation of the first output transistor 1. Thus when the ON current of the first output transistor is increased, a certain amount of current is supplied to the first output transistor 1. Therefore, even if the gate potential of the first output transistor 1 goes to high level, a change di/dt in Vcc current as a function of time with the increase in gate potential can be minimized. Therefore, noise generated at the Vcc node can be reduced.

On the other hand, when the above-mentioned "1" output state is released to set a high-impedance state, the input $\overline{C}$ is kept at "0" level, and the second transistor 2 is kept off. In this state, when the input C is set at low level "0", the output C' from the drive and control circuit 30 goes to low level, and the first output transistor 1 is turned off, thus setting a high-impedance state. In other words, in the drive and control circuit 30, when the input C goes to "0" level, the transistor P1 is turned on, and the gate of the transistor N4 is started to be charged. This gate potential goes to a value defined as $V_{cc}-2V_{TH}$ first, and the transistor N4 is started to be turned on. When a given delay time period determined by the inverters I1 and I2 and the MOS capacitors C1 and C2 has elapsed, an output from the inverter I2 goes to "0"- level, the transistor P2 is turned on, the gate potential of the transistor N4 goes to Vcc level, and a transconductance of the transistor N4 is increased. Therefore, the conductance of the transistor N4 is not rapidly increased. The first output transistor 1 is started to be turned off in accordance with the drain potential of the transistor N4. Note that, at this time, an output from the inverter I3 goes to "1" level, and an output from the inverter I13 through the seven inverters I7 to I13 is precharged to "0" level.

As described above, when the input C goes to "0", level, an output from the 2-input NAND gate NA goes to "1" level, an output from the inverter I20 goes to "0" level, and the drain potential of the transistor N7 is started to decrease to "0" level. When a given delay time period determined by the inverter I18 and the MOS capacitor C19 has elapsed, an output from the inverter I19 goes to "1" level, the transistor N7 is turned on, and its drain potential is started to set at "0". For this reason, the drain potential of the transistor N7 does not rapidly go to "0" level. The gate potential of the first output transistor 1 capacitively coupled to the drain of the transistor N7 by the MOS capacitor C20 is not rapidly set at "0" level. This gate potential is controlled by the transistor N4 controlled by a node D5, and is set at "0" level through two stages. Therefore, the conductance of the first output transistor 1 is not rapidly decreased, and a change di/dt in current as a function of time obtained when the Vcc current is turned off can be minimized, thus reducing noise generated at the Vcc node.

Note that when the input C is set at low level "0", and the input $\overline{C}$ is set at high level "1", the first transistor 1 is turned off, and the second transistor 2 is turned on, thus setting a "0" output state.

According to the above-mentioned output circuit shown in FIG. 7, when the first transistor 1 is turned on, an abrupt flow of a current from the Vcc node to the first transistor 1 can be prevented. In addition, when the first transistor 1 is turned off from an ON state, an abrupt cut-off of the current supplied from the Vcc node can also be prevented. Therefore, noise generated at the Vcc node can be reduced, and an operation error of the internal circuits of the integrated circuit can be prevented.

Figure 9:
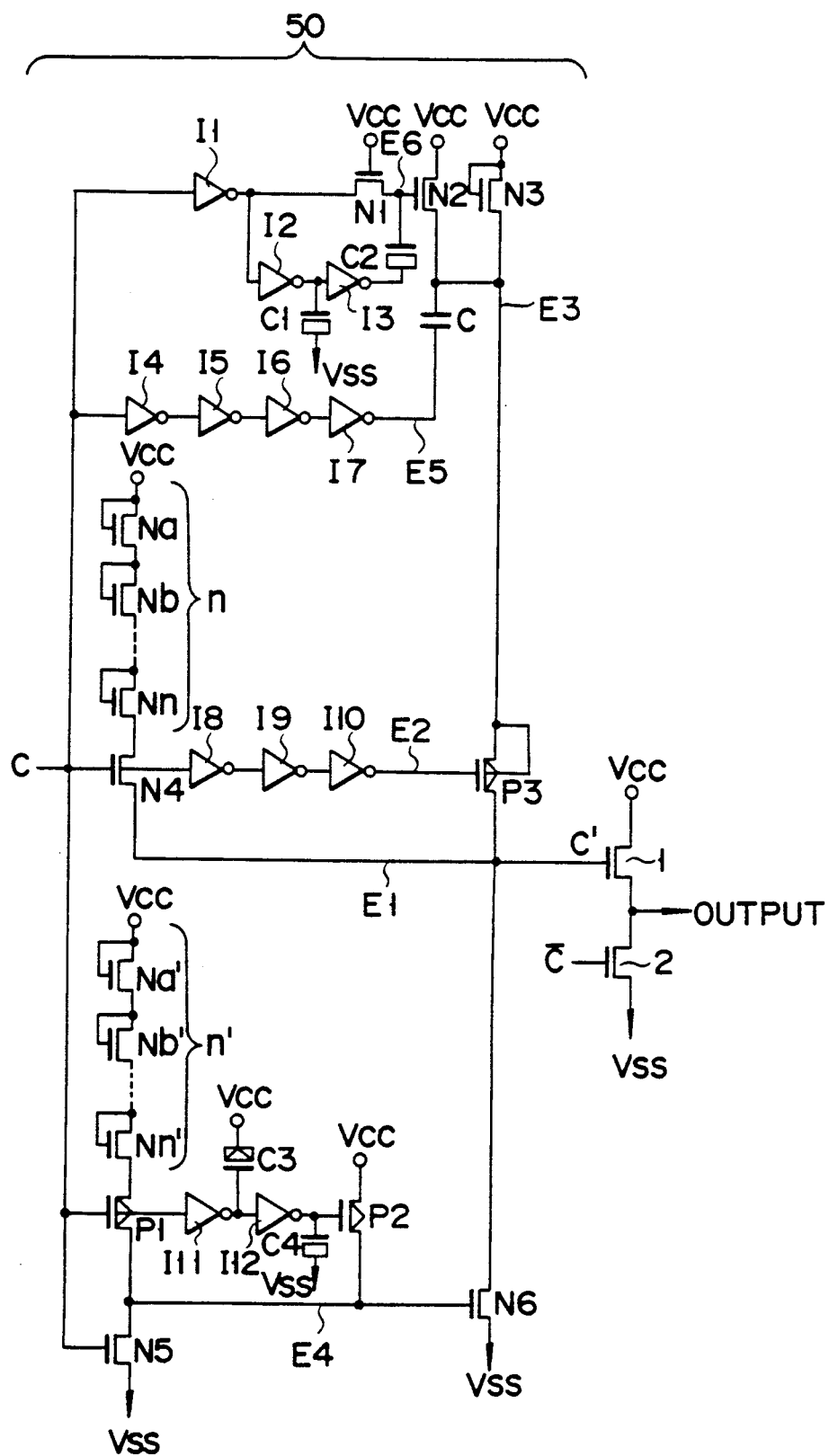
FIG. 9 is a circuit diagram showing another arrangement of the output circuit of the semiconductor integrated circuit according to the second embodiment of the present invention.

FIG. 9 shows another arrangement of the output circuit of the semiconductor integrated circuit according to the second embodiment of the present invention. The first and second output MOS n-channel transistors 1 and 2 are connected in series between the Vcc and Vss power source nodes. The gates of the two transistors receive different signals C' and $\overline{C}$, respectively, and a series-connected point of the two transistors serves as an output node. Reference numeral 50 denotes a drive and control circuit for driving and controlling the first transistor 1 connected to the Vc node. In the drive and control circuit 50, when the first transistor 1 connected to the Vcc node is turned on, its gate potential is changed in a two-stage manner. That is, the gate potential is rapidly increased to some extent to a level at which a transconductance of the first transistor is not extremely increased. Thereafter, the gate potential is slowly increased to a level at which the transconductance of the first transistor is sufficiently high. When the first transistor 1 is turned off from an ON state, its gate potential is changed in a two-stage manner. That is, the gate potential is slowly decreased until the transconductance of the first transistor 1 is decreased to some extent. Thereafter, the gate potential is decreased to a level at which the transconductance of the first transistor 1 is sufficiently low. For example, this drive and control circuit 50 is arranged, as shown in FIG. 9.

More specifically, the input C is supplied to the gate of the n-channel transistor N2, the drain of which is connected to the Vcc node, through the inverter I1 and the n-channel transistor N1, the gate of which is connected to the Vcc node. The two inverters I2 and I3 and the MOS capacitor C2 consisting of an n-channel MOS transistor, the drain and source of which are connected, are connected between the output node of the inverter I1 and the gate of the transistor N2. The MOS capacitor C1 consisting of an n-channel MOS transistor, the drain and source of which are connected to the Vss node, is connected between the output node of the inverter I2 and the Vss node.

The input C is also supplied to the source of the transistor N2 through the four inverters I4 to I7 and a capacitor C. The n-channel transistor N3, the drain and gate of which are connected to each other, is connected between the source of the transistor N2 and the Vcc node. A p-channel transistor P3, the source and gate of which are connected to each other, and the n-channel transistor N6 are connected between the source of the transistor N3 and the Vss node. An interconnecting point of the drains of the transistors P3 and N6 is connected to the gate of the first output transistor 1. The n n-channel transistors Na to Nn, the drains and gates of which are connected to each other, and the n-channel transistor N4, the gate of which receives the input C, are connected in series between the Vcc node and the interconnecting points of the drains of the transistors P3 and N6. A threshold voltage of each of the n n-channel transistors Na to Nn is denoted by reference symbol VTH. The input C is supplied to the gate of the transistor P3 through the three inverters I8 to I10.

In addition, n' n-channel transistors Na' to Nn', the drains and gates of which are connected to each other, the p-channel transistor P1, the gate of which receives the input C, and the n-channel transistor N5, the gate of which receives the input C, are connected in series between the Vcc and Vss nodes. A threshold voltage of each of the n' n-channel transistors Na' to Nn' is denoted by reference symbol VTH. A connecting point of the p- and n-channel transistors P1 and N5 is connected to the gate of the transistor N6. The p-channel transistor P2 is connected between the gate of the transistor N6 and the Vcc node. The gate of the p-channel transistor P2 receives the input C through the two inverters I11 and I12. The MOS capacitor C3 consisting of a p-channel MOS transistor, the drain and source of which are connected to the Vcc node, is connected between the Vcc node and the output node of the first inverter I11 of the two inverters I11 and I12. A MOS capacitor C4 consisting of an n-channel MOS transistor, the drain and source of which are connected to the Vss node is connected between the Vss node and the output node of the second inverter I12 of the two inverters I11 and I12.

An operation of the output circuit shown in FIG. 9 will be described below with reference to FIG. 10. When "1" output is performed, the input $\overline{C}$ is kept at low level "0", and the second transistor 2 is kept off. In this state, when the input C is set at high level "1", an output node E1 of the drive and control circuit 50 goes to high level, and the first output transistor 1 is turned on, thus setting a "1" output state. In other words, in the drive and control circuit 50, when the input C goes to "1" level, the n-channel transistor N4 is immediately turned on, and a voltage defined as Vcc−n.VTH appears at the output node E1. When the voltage Vcc−n.VTH goes to a level at which a transconductance of the first output transistor 1 is not extremely increased, a current is not rapidly supplied from the Vcc node to the output node. As a result, at this time, Vcc noise defined as L.(di/dt) can be minimized.

When the input C goes to "1" level, the transistor N5 is turned on, the potential of a node E4 goes to "0" level, and the transistor N6 is turned off. At this time, the transistor P1 is turned off in accordance with "1" level of the input C, and the transistor P2 is turned off in accordance with "1" level of the inverter I12. After the transistor N4 is turned on, an output node E2 of the inverter I10 goes to "0" level, and the transistor P3 is turned on. At this time, since the source (node E3) of the transistor P3 is precharged at Vcc level, the output node E1 is started to increase to Vcc level. In addition, when a node E5 goes to "1" level through the inverters I4 to I7 after the input C goes to "1" level, the node E3 goes to a level higher than Vcc level by the static induction with the capacitor C, and the output node E1 also goes to a level higher than Vcc level. The transconductance of the first output transistor 1 is sufficiently high to assure "1" output level. At this time, a certain amount of current has already flown through the first transistor 1, and Vcc noise defined as L.(di/dt) is small. In addition, when the size of the inverter I7 or the transistor P3 is decreased, a rate to increase the potential of the output node E1 from Vcc−n.VTH to a level higher than Vcc level can be suppressed.

On the other hand, when the above-mentioned "1" output state is released to set a high-impedance state, the input $\overline{C}$ is kept at low level "0", and the second transistor 2 is kept to be OFF. In this state, when the input C is set at low level "0", the output node E1 of the drive and control circuit 50 goes to "0" level, and the first output transistor 1 is turned off, thus setting a high impedance state. In other words, in the drive and control circuit 50, when the input C goes to "0" level, the transistor N5 is turned off, and the transistor P1 is turned on. Then, the node E4 goes to a level Vcc−n.VTH, and the transistor N6 is turned on. At this time, however, since a transconductance of the transistor N6 is not sufficiently high, the potential of the output node E1 is not rapidly decreased. For this reason, the transconductance of the first output transistor 1 is not rapidly decreased. At this time, a change in current supplied to the first output transistor 1 as a function of time can be minimized, and noise defined as L.(di/dt) can be minimized.

When the transistor N6 is turned on, both the output nodes E1 and E3 go to low level. However, since the node E2 goes to "1" level, the level of the node E3 is decreased to a level defined as Vcc+VTH (VTH is a threshold voltage of the p-channel transistor P3). Thereafter, when the node E5 is set at "0" level, the level of the node E3 is further decreased by the static induction with the capacitor C. When the input C goes to "0" level, the gate (node E6) of the transistor N2 is precharged to a potential defined as Vcc−VTH (VTH is a threshold voltage of the n-channel transistor N1). In addition, when a delay time period determined by the inverters I2 and I3 and the capacitor C1 has elapsed, the node E6 goes to a level higher than Vcc level, and the node E3 is precharged at Vcc level by the transistor N2. At this time, the transistor P3 is OFF.

When the transistor P1 is turned on in accordance with "0" level of the input C, and a delay time period determined by the inverters I11 and I12 and the capacitors C3 and C4 has elapsed, the transistor P2 is turned on, the node E4 goes to Vcc level, a transconductance of the transistor N6 is sufficiently increased, the output node E1 goes to "0" level, and the first output transistor 1 is completely turned off. At this time, however, the output node E1 goes to a level at which a transconductance of the first output transistor 1 is decreased to some extent. Therefore, even if the output node E1 goes to "0" level, a change in current supplied to the first output transistor 1 as a function of time is not largely changed, and noise defined as L.(di/dt) can be minimized.

Note that when the input C is set at low level "0", and the input $\overline{C}$ is set at high level "1", the first transistor 1 is turned off, and the second transistor 2 is turned on, thus setting a "0" output state.

According to the above-mentioned output circuit shown in FIG. 9, when the first transistor 1 is turned on, an abrupt flow of a current into the first transistor 1 from the Vcc node ca be prevented. In addition, when the first transistor 1 is turned off from an ON state, an rapid cut-off of the current supplied from the Vcc node can be prevented. Therefore, noise generated at the Vcc node can be reduced, and an operation error of the internal circuits of the integrated circuit can also be prevented.

Figure 11:
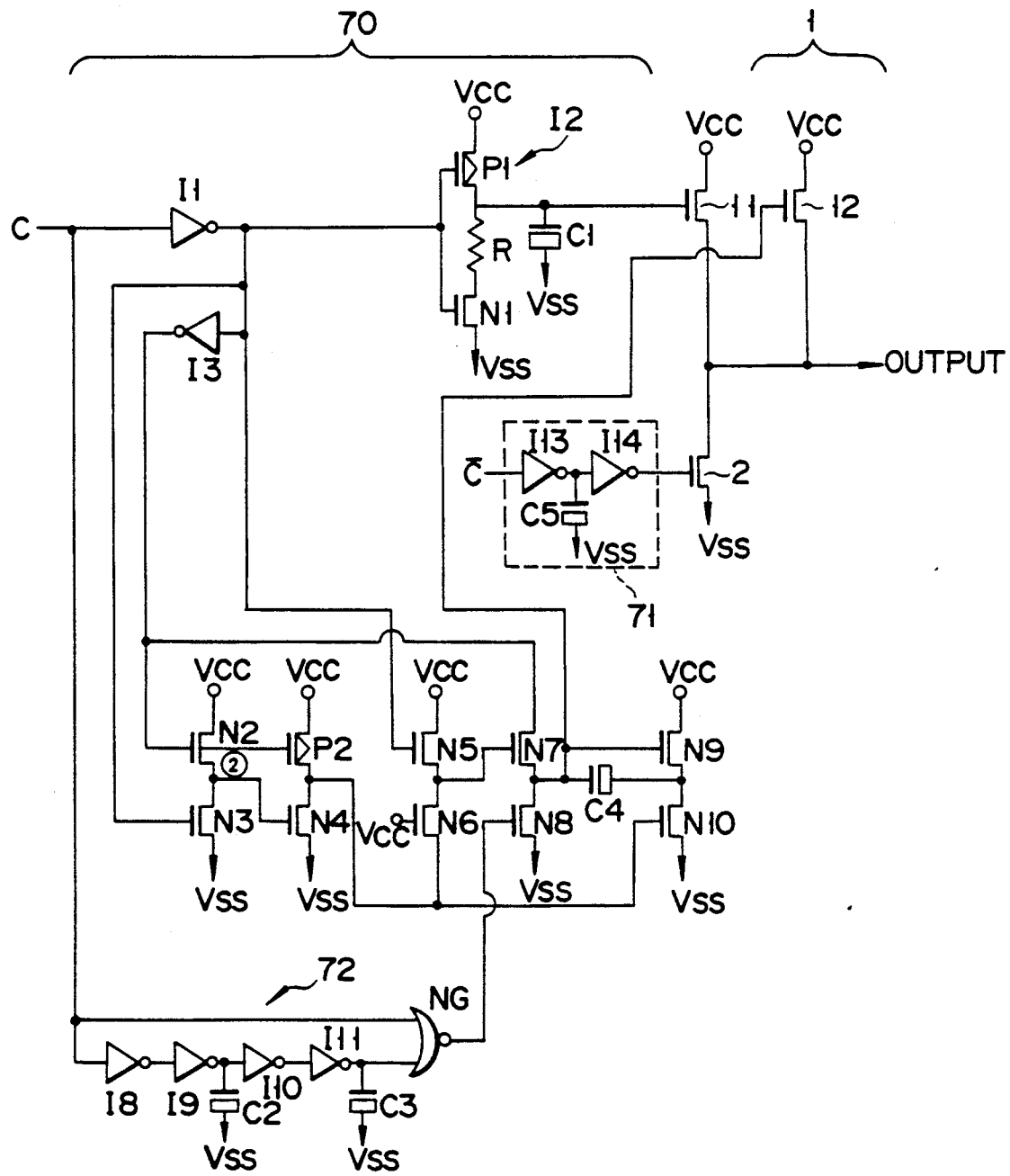
FIG. 11 is a circuit diagram of an output circuit of a semiconductor integrated circuit according to a third embodiment of the present invention.

FIG. 11 shows an arrangement of an output circuit of a semiconductor integrated circuit according to a third embodiment of the present invention. First and second output MOS n-channel transistors 1 and 2 are connected in series between Vcc and Vss power source nodes. The gates of the two transistors receive different signals, respectively. A series-connected point of the two transistors serves as an output node. The first transistor is divided into a plurality of (two in this embodiment) transistors (11 and 12). Reference numeral 70 denotes a drive and control circuit for driving and controlling the first transistor 1 connected to the Vcc node; and 71, a drive and control circuit for driving and controlling the second transistor 2 connected to the Vss node. In the drive and control circuit 70, when the first transistor 1 is turned off from an ON state, a predetermined time difference is set between a falling edge of a gate potential of one of the two divided transistors (11 and 12), and a falling edge of a gate potential of the other transistor to cause the falling edge of the gate potential of one transistor to slowly change as compared with the falling edge of the gate potential of the other transistor. For example, the drive and control circuit 70 is arranged, as shown in FIG. 11.

More specifically, an input C is input to an inverter I1, and an output from the inverter I1 is input to an inverter I2 constituted by connecting a p-channel transistor P1, a resistor R, and an n-channel transistor N1 in series between the Vcc and Vss nodes. A connecting point of the p-channel MOS transistor P1 and the resistor R is connected to the gate of the transistor 11 of the first output transistors (11 and 12). A MOS capacitor C1 consisting of an n-channel MOS transistor, the drain and source of which are connected to the Vss node, is connected between the gate of the transistor 11 and the Vss node.

An output from the inverter I1 is input to an inverter I3. Outputs from the inverters I3 and I1 are input to the gates of n-channel transistors N2 and N3 connected in series between the Vcc and Vss nodes, respectively. The output node of the inverter I3 and a connecting point of the transistors N2 and N3 are connected to the gates of p- and n-channel transistors P2 and N4, respectively. N-channel transistors N5 and N6 are connected in series between the Vcc node and a connecting point of the transistors P2 and N4. A output from the inverter I1 and the Vcc potential are input to the gates of the transistors N5 and N6, respectively. N-channel transistors N7 and N8 are connected in series between the output node of the inverter I3 and the Vss node, and a connecting point of the transistors N5 and N6 is connected to the gate of the transistor N7.

The input C is input to the gate of the transistor N8 through a delay circuit 72. In the delay circuit 72, the input C is directly input to one input terminal of a 2-input NOR gate NG, and is also input to the other input terminal of the 2-input NOR gate NG through four inverters I8 to I11. MOS capacitors C2 and C3 each consisting of an n-channel MOS transistor, the drain and source of which are connected to the Vss node, are connected between the Vss node and the output nodes of the second and fourth inverters of the four inverters I8 and I11. A connecting point of the transistors N7 and N8 is connected to the gate of the other transistor 12 of the first output transistors (11 and 12), and is also connected to the gate of a transistor N9 of n-channel transistors N9 and N10 connected in series between the Vcc and Vss nodes. A MOS capacitor C4 consisting of an n-channel MOS transistor, the drain and source of which are connected to each other, is connected between the source of the transistor N9 and the connecting point of the transistors N7 and N8. A connecting point of the transistors P2 and N4 is connected to the gate of the transistor N10.

The drive and control circuit 71 includes an inverter I13 for receiving an input $\overline{C}$ which is complementary with the input C, an inverter I14 for inverting an output from the inverter I13 to supply the inverted output to the gate of the second output transistor 2, and a MOS capacitor C5 connected between the output node of the inverter I13 and the Vss node. The MOS capacitor C5 consists of an n-channel MOS transistor, the drain and source of which are connected to the Vss node.

An operation of the output circuit shown in FIG. 11 will be described hereinafter. When a "1" output state is set, the input $\overline{C}$ is kept at low level "0", and the second transistor 2 is kept off. In this state, when the input C is set at high level "1", an output from the drive and control circuit 70 goes to high level, and the first output transistors (11 and 12) are turned on. In other words, in the drive and control circuit 70, when the input C goes to "1" level, an output from the inverter I1 goes to "0" level, an output from the inverter I2 goes to "1" level, the gate potential of one transistor 11 of the first transistors (11 and 12) is increased, and the transistor 11 is turned on. In addition, an output from the inverter I3 goes to "1" level. This "1" level is applied to one terminal of the transistor N7, and the potential of the other terminal of the transistor N7 goes to "1" level. The gate potential of the other transistor 12 of the first transistors (11 and 12) is increased, and the transistor 12 is turned on.

The transistor N2 is turned on in response to a "1" output from the inverter I3, and the potential of the connecting point of the transistors N2 and N3 goes to Vcc−VTH. Therefore, the transistor N4 is turned on, and the potential of the connecting point of the transistors N4 and P2 goes to "0" level. Therefore, when the transistor N10 is turned off, and the potential of the connecting point of the transistors N10 and N9 is started to go to "1" level, the potential of the other terminal of the transistor N7, coupled to the output terminal of the transistors N10 and N9 by the MOS capacitor C4, is further increased to be higher than Vcc level, and Vcc level of the "1" output is assured by the transistor 12.

When the "1" output state is to be released to set a high-impedance state, the input $\overline{C}$ is kept at low level "0", and the second transistor 2 is kept off. In this state, when the input C is set at low level "0", an output from the drive and control circuit 70 goes to low level, and the first output transistors (11 and 12) are turned off, thus setting a high-impedance state. In other words, in the drive and control circuit 70, when the input C goes to "0" level, an output from the inverter I1 goes to "1" level, and an output from the inverter I2 goes to "0" level to decrease the gate potential of one transistor 11 of the first transistors (11 and 12). At this time, however, the gate potential is not rapidly but slowly decreased in accordance with a time constant of the MOS capacitor C1 and the resistor R, and the transistor 11 is slowly turned off. At this time, an output from the 2-input NOR gate NG does not go to "1" level immediately, but when a delay time period determined by the four inverters I8 to I11 and the MOS capacitors C2 and C3 has elapsed. Therefore, the transistor N8 is turned on and the potential of the other terminal of the transistor N7 goes to "0" level. Therefore, the gate potential of the other transistor 12 of the first transistors (11 and 12) is decreased, and the transistor 12 is turned off. At this time, in order to prevent an abrupt ON state of the transistor N7 even if the input C goes to low level, the sizes of the transistors N5 and N6 are decreased, or an abrupt "0" state of the inverter I3 is prevented.

According to the above-mentioned output circuit shown in FIG. 11, when the first transistor 1 is turned off from an ON state, the first transistors (11 and 12) are sequentially turned off. Therefore, an abrupt cut-off of a current supplied from the Vcc node can be prevented, and noise generated at the Vcc node can also be reduced, thus preventing an operation error of the internal circuits of the integrated circuit

What is claimed is:

1. An output circuit for a semiconductor integrated circuit comprising:

first and second power source nodes;

first and second output MOS transistors coupled in series between said first and second power source nodes and controlled by respective first and second gate potentials applied thereto in accordance with first and second control signals;

an output node coupled to a point between said series connected first and second output MOS transistors;

control means for controlling the first and second gate potentials, said control means including means responsive to a transition of the second control signal from a high level to a low level for decreasing the gate potential of said second output transistor until a transconductance of said second output transistor is decreased to a predetermined first level, and for subsequently decreasing the gate potential of said second output transistor until the transconductance of said second transistor is decreased to a second level lower than said first level.

2. The output circuit according to claim 1, wherein said control means responsive to a transition of the second control signal comprises a circuit having a time constant which is determined by a capacitor and a resistor, said circuit constituting means for moderately decreasing the gate potential of said second transistor when said second control signal goes from high level to low level, and said first and second transistors are set in a high-impedance state.

3. An output circuit for an integrated circuit comprising:
   first and second power source nodes;
   first and second output MOS transistors coupled in series between said first and second power source nodes and controlled by respective first and second gate potentials applied thereto in accordance with first and second control signals;
   an output node coupled to a point between said series connected first and second output MOS transistors; and
   control means for decreasing a gate potential of said first transistor stepwise when said first transistor is turned off from an ON state.

4. The output circuit according to claim 3, wherein said control means includes first means for decreasing a gate potential of said first transistor at a first rate when said first signal goes from high level to low level and said first and second transistors are set in a high-impedance state, and second means for subsequently decreasing the gate potential of said first transistor at a second rate more rapid than said first rate.

5. An output circuit of an integrated circuit comprising:
   a first output MOS transistor comprising a plurality of MOS transistors, each of said plurality having one current path connected to a first power source node, having the other current path connected to an output node and having a gate for receiving a signal;
   a second output MOS transistor having one current path connected to a second power source node and the other current path connected to said output node; and
   control means for setting a delay time between falling edges of gate potentials of said MOS transistors which constitute said first output MOS transistor when said first MOS transistor is turned off from its ON state.

6. The output circuit according to claim 5, wherein said control decreasing at a first rate a gate potential of said MOS transistor which is turned off first in said plurality of MOS transistors, and for decreasing at a second rate a gate potential of said MOS transistor which is turned off following said MOS transistor which is turned off first such that the second gate potential decreasing rate is higher than said first gate potential decreasing rate.

7. An output circuit according to claim 1, wherein said first and second output MOS transistors are of the same impurity type.

8. An output circuit according to claim 3, wherein said first and second output MOS transistors are of the same impurity type.

9. An output circuit for a semiconductor integrated circuit comprising:
   first and second power source nodes;
   first and second output MOS transistors coupled in series between said first and second power source nodes and controlled by respective first and second gate potentials applied thereto in accordance with first and second control signals;
   an output node coupled to a point between said series connected first and second output MOS transistors; and
   control means for controlling the first and second gate potentials, said control means including means responsive to a transition of the second control signal from a low level to a high level for increasing the gate potential of said second output transistor until a transconductance of said second output transistor is increased to a predetermined first level, and for subsequently increasing the gate potential of said second output transistor until the transconductance of said second transistor is increased to a second level higher than said first level.

10. An output circuit according to claim 9, wherein said first and second output MOS transistors are of the same impurity type.

11. An output circuit for a semiconductor integrated circuit comprising:
    first and second power source nodes;
    first and second output MOS transistors coupled in series between said first and second power source nodes and controlled by respective first and second gate potentials applied thereto in accordance with first and second control signals;
    an output node coupled to a point between said series connected first and second output MOS transistors; and
    control means for increasing a gate potential of said first transistor stepwise when said first transistor is turned on from an OFF state.

12. The output circuit according to claim 11, wherein said control means includes first means for increasing a gate potential of said first transistor at a first rate when said first signal goes from low level to high level, and second means for subsequently increasing the gate potential of said first transistor at a second rate less rapid than said first rate.

13. An output circuit according to claim 11, wherein said first and second output MOS transistors are of the same impurity type.

* * * * *